(12) United States Patent
Huang et al.

(10) Patent No.: US 6,541,782 B2
(45) Date of Patent: Apr. 1, 2003

(54) ELECTRON BEAM PHOTOLITHOGRAPHIC PROCESS

(75) Inventors: I-Hsiung Huang, Kaohsiung (TW); Jiunn-Ren Hwang, Hsinchu (TW)

(73) Assignee: United Microelectronics Copr., Hsinchu (TW)

( * ) Notice: Subject to any disclaimer, the term of this patent is extended or adjusted under 35 U.S.C. 154(b) by 212 days.

(21) Appl. No.: 09/734,240

(22) Filed: Dec. 5, 2000

(65) Prior Publication Data

US 2002/0063222 A1 May 30, 2002

(30) Foreign Application Priority Data

Nov. 28, 2000 (TW) .......................................... 89125181 A

(51) Int. Cl.$^7$ ............................. H01L 21/00; G03F 9/00
(52) U.S. Cl. ............................. 250/492.22; 250/492.1; 250/492.2; 355/53; 356/244; 430/313; 430/314; 430/315
(58) Field of Search .................... 250/492.22, 492.1, 250/492.2; 356/244; 430/313, 314, 315; 355/53

(56) References Cited

U.S. PATENT DOCUMENTS 5,869,175 A * 2/1999 Sardella ...................... 430/319
6,264,805 B1 * 7/2001 Forrest et al. ............ 204/192.26

* cited by examiner

*Primary Examiner*—Bruce Anderson
*Assistant Examiner*—Nikita Wells
(74) *Attorney, Agent, or Firm*—Charles C.H. Wu; Wu & Cheung, LLP

(57) ABSTRACT

An electron beam photolithographic process for patterning an insulation layer over a substrate. A conductive photoresist layer having a conjugate structure is formed over the insulation layer. An electron beam photolithographic process is conducted using a photomask so that the pattern on the photomask is transferred to the conductive photoresist layer.

6 Claims, 1 Drawing Sheet

ELECTRON BEAM PHOTOLITHOGRAPHIC PROCESS

CROSS-REFERENCE TO RELATED APPLICATION

This application claims the priority benefit of Taiwan application serial no. 89125181, filed Nov. 28, 2000.

BACKGROUND OF THE INVENTION

1. Field of Invention

The present invention relates to a photolithographic process. More particularly, the present invention relates to an electron beam photolithographic process that can prevent charge accumulation.

2. Description of Related Art

As dimensions of a semiconductor device is reduced to the sub-micron range, electron beam photolithographic techniques have to be employed. This is because an electron beam has a smaller wavelength (about 13.5 nm). Unlike optical photolithographic techniques, the resolution of an electron beam is not limited by diffraction. However, an electron beam is limited by electron dispersion on the surface of an object as well as aberration control of optical direction and shape. In general, electron beam photolithographic technique involves the production of a photomask and the transfer of pattern from the photomask to a photoresist layer on a substrate.

One major problem for using electron beam in photolithographic process is the accumulation of electric charges in the photoresist layer. To form a pattern on a substrate using an electron beam, a photoresist layer is first formed over a substrate. The photoresist layer is selectively exposed by an electron beam. Through exposure to the electron beam, physical and chemical properties of the photoresist material are changed. Regions subjected to electron beam radiation will become soluble or insoluble, depending on the photoresist material chosen. Thereafter, a chemical developer is applied to react with the exposed or unexposed photoresist material so that the exposed or unexposed photoresist layer is removed. The residual resist layer can subsequently be used as a protective mask for etching or ion implantation operation.

In general, photoresist is made from a hard polymeric material having high insulation capability. When an electron beam shines on the surface of a photoresist layer, electric charges produced by the electron beam will accumulate on the photoresist surface creating an electric field, thereby distorting the electron beam close to the surface. Since a narrow beam of smaller than 13.5 nm is often used in electron beam photolithography, the accumulation of minute electric charges on the surface can result in considerable beam distortion. Any distortion of the electron beam may lead to loss in precision, errors in pattern and extension inaccuracy.

SUMMARY OF THE INVENTION

Accordingly, one object of the present invention is to provide an electron beam photolithographic process for patterning an insulation layer over a substrate. First, a conductive photoresist layer having a conjugate structure is formed over the insulation layer. An electron beam photolithographic process is conducted using a photomask so that the pattern on the photomask is transferred to the conductive photoresist layer. Alternatively, the pattern is transferred by directly using the electron beam without any mask.

The conductive polymer having a conjugate structure is able to form a mutual conjugate bonding structure and the electrons within the material are in a dynamic resonance state. Hence, when an electron beam is used in a photolithographic process, electric charges accumulated on the photoresist layer can be rapidly conducted away by the resonance effect in the conjugate structure of the conductive polymer. Without the accumulation charges on the photoresist layer, electron beam distortion will not occur and resolution of electron beam photolithography can be maintained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
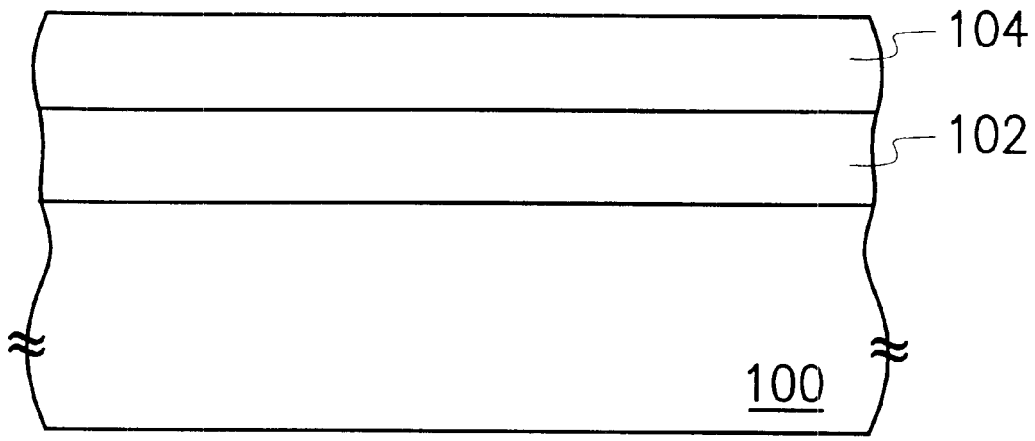
FIGS. 1A and 1B are schematic cross-sectional views showing the steps for performing an electron beam photolithographic process using a conductive polymer.

Reference will now be made in detail to the present preferred embodiments of the invention, examples of which are illustrated in the accompanying drawings. Wherever possible, the same reference numbers are used in the drawings and the description to refer to the same or like parts.

When an electron device shrinks to sub-micron dimensions, the resolution of photolithographic process that uses visible or ultraviolet light is severely limited by wavelength of the light source. Compared with visible and ultraviolet light, an electron beam has a much shorter wavelength and hence has very high resolution. Therefore, electron beam photolithography is ideal for forming extremely small devices. However, a number of factors limit the usefulness of the electron beam photolithographic technique. A principle limitation is the built-up of electrostatic charges on the surface of an insulating photoresist layer, thereby distorting the incoming electron beam during photolithographic processing. A beam distortion is likely to result in pattern transfer errors and extension imprecision.

This invention is related to the addition of a conductive polymer over a photoresist layer before carrying out an electron beam photolithographic process. The conductive polymer includes a compound that has a conjugate structure, for example, a phenylene vinylene conjugate structure or a phenylene carbonylene conjugate structure.

The conductive polymer having a conjugate structure is able to form a mutual conjugate bonding structure and the electrons within the material are in a dynamic resonance state. Hence, when an electron beam is used in a photolithographic process, electric charges accumulated on the photoresist layer can be rapidly conducted away by the resonance effect in the conjugate structure of the conductive high molecular weight material. Without the accumulation charges on the photoresist layer, electron beam distortion and hence the lower of resolution will not occur.

Figure 1B:
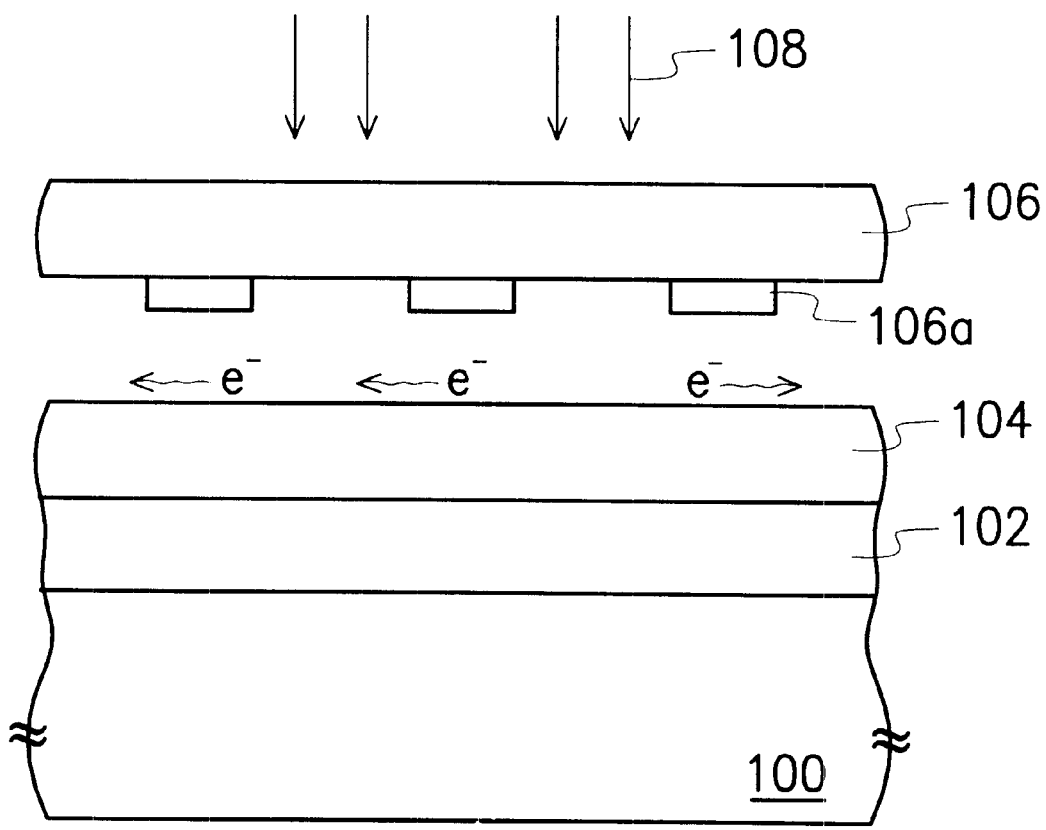

FIGS. 1A and 1B are schematic cross-sectional views showing the steps for performing an electron beam photolithographic process using a conductive polymer. As shown in FIG. 1A, a substrate 100 having a plurality of semiconductor devices (not shown) thereon is provided. An insulation layer 102 and a photoresist layer 104 are sequentially formed over the substrate 100. The insulation layer 102 can be a silicon oxide layer or a silicon nitride layer formed, for example, by chemical vapor deposition. The photoresist layer 104 can be made from a deep ultraviolet photoresist material that also contains a conductive high molecular weight compound. The high molecular weight compound includes a high molecular weight substance with a conjugate molecular structure such as a phenylene vinylene conjugate structure or a phenylene carbonylene conjugate structure.

As shown in FIG. 1B, an electron beam photolithographic process is carried out using a photomask 106 having a pattern 106a thereon. In the process, the pattern 106a on the photomask 106 is transferred to the photoresist layer 104 via an electron beam 108.

Since the photoresist layer 104 is supported by a non-conductive insulation layer 102, electric charges generated by the electron beam may accumulate in the photoresist layer 104. However, the photoresist layer 104 contains a conductive polymer. When the electron beam 108 shines on the photoresist layer 104 via a patterned photomask 106, the conjugate structure of the conductive high molecular weight compound will conduct the accumulated electrons (e$^-$) away as soon as they are formed. Hence, electron beam distortion caused by a charge-built electric field can be prevented. Ultimately, resolution of the photoresist layer can be increased and sensitivity of post-exposure bake can be lowered. In brief, the process is highly suitable for increasing the level of integration and forming devices with narrow line width.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electron beam photolithographic process for patterning an insulating layer above a substrate, comprising the steps of:

forming a conductive photoresist having a conjugate molecular structure over the insulation layer; and performing an electron beam photolithographic process using a photomask having a pattern thereon so that the pattern is transferred to the conductive photoresist layer.

2. The process of claim 1, wherein the conjugate molecular structure includes a phenylene vinylene conjugate structure.

3. The process of claim 1, wherein the conjugate molecular structure includes a phenylene carbonylene conjugate structure.

4. A method for preventing the accumulation of electric charges in a photoresist layer, comprising the steps of:

providing a substrate having an insulation layer thereon;

forming a conductive photoresist layer having an electron resonance structure over the insulation layer; and performing an electron beam photolithographic process to transfer a pattern on a photomask to the conductive photoresist layer.

5. The method of claim 4, wherein the electron resonance structure includes a phenylene vinylene conjugate structure.

6. The method of claim 4, wherein the electron resonance structure includes a phenylene carbonylene conjugate structure.

* * * * *